United States Patent [19]

Lindmayer

[11] 4,226,017

[45] Oct. 7, 1980

[54] METHOD FOR MAKING A SEMICONDUCTOR DEVICE

[75] Inventor: Joseph Lindmayer, Bethesda, Md.

[73] Assignee: Solarex Corporation, Rockville, Md.

[21] Appl. No.: 905,978

[22] Filed: May 15, 1978

[51] Int. Cl.$^2$ ............................................. B01J 17/00
[52] U.S. Cl. ....................................... 29/572; 29/589; 29/590; 136/261; 136/256; 148/177
[58] Field of Search .......................... 29/572, 589, 590; 148/177, 178; 357/67

[56] References Cited

U.S. PATENT DOCUMENTS

| | | | |
|---|---|---|---|
| 3,895,975 | 7/1975 | Lindmayer | 148/178 |
| 4,075,754 | 2/1978 | Cook | 29/571 |
| 4,077,045 | 2/1978 | Greeson | 357/67 |

*Primary Examiner*—W. C. Tupman
*Attorney, Agent, or Firm*—Watson, Cole, Grindle & Watson

[57] ABSTRACT

A method for use in making semiconductor type electrical devices such as solar cells. In the method, a wafer of semiconductor material having two major surfaces is provided, the wafer being doped with an impurity of one conductivity type. A layer of a metal-containing compositions such as aluminum, is placed on one of the major surfaces of the wafer, and the wafer is then heated in the presence of an impurity of the opposite conductivity type to a temperature such that a high-low junction is formed by the metal at one major surface while the impurity of the opposite conductivity type diffuses or penetrates the other major surface to form a p-n junction thereat.

9 Claims, No Drawings

METHOD FOR MAKING A SEMICONDUCTOR DEVICE

BACKGROUND OF THE INVENTION

The present invention relates to a method for use in making semiconductor devices and, more specifically, is directed to a method particularly adapted for the manufacture of photovoltaic solar energy cells.

In a prior patent, U.S. Pat. No. 3,895,975, on which I am named as patentee, a method for making solar cells and other semiconductor devices is disclosed whereby problems associated with back surface diffusion of impurities and stress formation in semiconductor device manufacture are significantly reduced while at the same time two junctions having improved electrical characteristics were formed within the device. That patent is entitled, Method for the Post-Alloy Diffusion of Impurities into a Semiconductor.

The method disclosed in that patent is unclear and is described in differing and conflicting ways in the specification. However, it is apparent that it includes placing a layer of alloying material, such as aluminum, on the back surface of a silicon wafer doped with an impurity of one conductivity type, then heating the wafer to a temperature at which an alloy of the alloying and semiconductor materials will be formed. At least as recited in the claims of that patent, the alloying material also diffuses into the semiconductor material. Thereafter, an impurity of the opposite conductivity type, such as phosphorus, is diffused into the front surface of the wafer.

While the method set forth above can produce semiconductor devices of satisfactory quality, the method is unsatisfactory in at least one important respect for use in the high-volume production of semiconductor devices, particularly photovoltaic cells. Thus, the requirement of the patented method that the layer of alloy material first be alloyed with the semiconductor material and subsequently diffused with an impurity from a gaseous medium necessarily requires that either the method be limited to a batch-type operation, or that expensive and complicated equipment for a continuous-type operation must be provided. In explanation, where two different atmospheres are to be used in a continuous production line employing belts to convey the wafers, two furnaces would be necessary, one having an inert atmosphere, the second atmosphere containing the diffusant gas. Multiple furnaces and, quite possibly, the need for multiple conveyor belts present a complication and expense that is definitely undesirable.

SUMMARY OF THE INVENTION

It is therefore an object of the present invention to provide a method for use in the manufacture of semiconductor type devices, particularly solar cells, which can be performed in a continuous-type operation without the necessity for expensive and duplicative production equipment.

Another object of the present invention is to provide a method for use in the manufacture of semiconductor type devices which reduces the time necessary for such manufacture.

Briefly, the present invention in its broader aspects comprehends a method for making a semiconductor device comprising providing a wafer of semiconductor material having two major surfaces, the wafer having been doped with an impurity of one conductivity type, contacting one of the major surfaces with a layer of a metal-containing composition, and then heating the wafer in the presence of an impurity of a second conductivity type to a temperature at which the metal diffuses into that one wafer surface while the impurity of the opposite conductivity type diffuses into the other major surface of the wafer. Electrical junctions are thereby concomitantly formed at the two major surfaces of the wafer.

Viewing my present method in greater detail, the host material of the wafer is preferably silicon of the monocrystalline type, or of the semicrystalline type disclosed in my copending U.S. Patent Application Ser. No. 751,342, filed Dec. 16, 1976. The manner and type of impurity by which the wafer may be doped, for example, with boron, will be readily apparent to one of ordinary skill in the art.

The material used to form a layer on one surface of the silicon is a metal or a composition containing a metal. While the metal may be selected from a variety of elements, mixtures and alloys, presently preferred metals are aluminum, chromium, titanium and tantalum. Preferred combinations include aluminum in combination with silicon, e.g., in the form of a silicon-aluminum mixture, or as silicon-coated aluminum particles, or aluminum oxide in combination with one or more metallic oxides such as cerium oxide, tantalum oxide and titanium oxide. In addition, it is possible to use metal complexes, among which the tin-aluminum complexes wherein the tin is the major element, comprising 90% or more of the complex. Most preferably a 95%–5% tin-aluminum complex can be utilized. Aluminum boride is another possible aluminum composition.

The particular thickness of the applied layer of metal is not believed to be critical. Generally, layers having a thickness of from about 5000 Å to about one or two microns have proved to be satisfactory in providing sufficient masking for the surface of the wafer to thereby prevent undesirable impurity diffusion into the protected wafer surface. Thicker layers in the above range are presently preferred.

The layer of material may be applied to the wafer by a variety of techniques, such as standard boat evaporation, electron beam evaporation, sputtering, plating and the like.

The simultaneous heating and diffusion of the wafer with the applied layer preferably takes place in a continuous belt type furnace to facilitate the mass production of the semiconductor devices. The furnace is provided with means for the introduction of impurity-containing gas for the diffusion of the wafer, if this method of diffusing an impurity into the wafer is to be utilized. The furnace is maintained at a temperature range of about 860° to 880° C. at which diffusion of the metal and the second conductivity type impurity will occur at substantially the same time. The residence time of the wafer within the furnace is generally governed by the desired final characteristics of the electrical device. Residence times of about 10 to 15 minutes have been found to be preferred in the manufacture of solar cells.

The following example sets forth a presently preferred method in accordance with my invention, where the method is used in the manufacture of solar cells. It should be understood that the example is given for the purpose of illustration only.

EXAMPLE

A circular wafer 2¼ inches in diameter and formed from monocrystalline silicon is provided. The wafer has a thickness of about 10 mils, and has been previously doped with the p-type impurity, boron. The wafer is thoroughly cleaned. A layer of aluminum is then applied to one of the major surfaces of the wafer by a conventional boat evaporation technique. The applied layer of aluminum has a thickness of about one micron and is applied to what will become the back surface of the subsequently formed photovoltaic cell.

The wafer with its applied layer of aluminum is then placed on the belt of a continuous furnace maintained at a temperature of about 870° C. The interior of the furnace is provided with a diffusant gas of helium, oxygen and phosphine, in which the respective flow rates of the gases are about 1,000, 75 and 550 cc/min. Upon entry of the wafer to the heated zone of the furnace, the phosphorus impurity starts to diffuse into the exposed, upwardly facing front surface of the wafer. As the temperature of the wafer rapidly increases to 870° C., a eutectic composition is formed between the aluminum and the silicon and the aluminum penetrates and diffuses into the back surface of the wafer.

The wafer remains in the furnace for about 10 minutes, i.e., until the desired diffusion of phosphorus into the front surface of the wafer is complete, at which time the belt has carried the wafer out of the furnace, after which the wafer is allowed to cool to room temperature.

To complete the manufacture of the solar cell, antireflective coatings are applied if desired and an electrical contact is attached to each major surface of the wafer. As so completed, the preferred end product of the present method is a photovoltaic cell having a p-n junction, more specifically here at the front surface thereof. The back surface of the cell has a zone of an alloy of silicon and aluminum extending inwardly thereof, and may have an additional coating of aluminum overlying it. Inwardly of said zone, the diffusion of the aluminum has created what may be termed a high-low junction, which in this instance is a p+-p junction.

As the junctions are defined herein, a p-n junction refers to a junction between p-type and n-type semiconductors. The term is broadly intended to cover such a junction in which the sequence of semiconductors is p-n or n-p. As defined in *Fundamentals of Semiconductor Devices,* Lindmayer and Wrigley, D. Van Nostrand Co., Inc., 1965, p. 113, a high-low junction is one wherein there is a high to low doping transition, such as a p+-p junction. The term is also intended to encompass a low-high junction and junctions of the n-type or p-type.

The metal-containing compositions have been previously described herein by reference to specific examples. While aluminum is a preferred metal and has been used, although not in the same method, it should be emphasized that my present invention is not limited to aluminum, which forms an alloy with silicon at a temperature below the temperature at which diffusion is carried out in my method. Thus, there is no requirement that an alloy be formed, e.g., when tantalum is used to form a p+-p junction, the diffusion temperature will be less than that at which the tantalum forms an alloy with silicon. Consequently, the tantalum will be sintered to the surface of the silicon wafer at diffusion temperatures, but will not be alloyed with the silicon, i.e., it will not have formed a eutectic composition with the silicon.

Further, in the best mode of my invention described hereinbefore, the opposite-type conductivity impurity, there phosphorus, has been diffused into the front surface of the silicon wafer from the gaseous state, i.e., from phosphine gas. Such diffusion, however, can take place other than by means of a gas. The source of the impurity can be a doped glass, such as a phosphor glass or boron glass. In addition, the impurity can be caused to penetrate the front surface of the wafer by ion implantation, after which the heating step of my method results in annealing the damage caused when the ions are implanted. Such annealing is carried out substantially concomitantly with the metal diffusion into the back surface of the wafer, so that a completed p-n front junction and a high-low back junction are formed during this single step.

As is evident from the above disclosure, the method of the present invention has the advantage of being able to be completed in a single heating step in a single furnace. No changes in the atmosphere within the furnace need be effected, and there need be no fluctuations in the temperature of the oven. Thus, while the present inventive method has particular advantages when used in a continuous operation, it has advantages, when a batch-type operation is used, since there will be no need to change atmospheres and temperatures, all as required in the method disclosed in my former patent.

It will be understood that the present invention is not limited to the manufacture of solar cells but may also be applied to the manufacture of other semiconductor devices employing electrical junctions. Furthermore, while the invention has been described by what are considered to be preferred embodiments thereof, it will be obvious to those skilled in this art that various changes and modifications may be made therein without departing from the scope of the invention, which is to be defined by the purview of the following, appended claims.

I claim:

1. A method of making a semiconductor device, comprising providing a wafer of host material, said wafer having two major surfaces and being doped with an impurity of one conductivity type, contacting one of said major surfaces with a layer of a metal-containing composition without alloying or sintering, and then heating said wafer in the presence of an impurity of a second conductivity type to a temperature at which, at least said metal of said metal-containing composition diffuses into and thereby alloys with or sinters to said one major surface to form a high-low junction thereat, while said second conductivity type impurity substantially concurrently forms a p-n junction at the other of said major surfaces.

2. A method as claimed in claim 1, in which said host material is silicon.

3. A method as claimed in claim 1, in which said semiconductor device is a photovoltaic cell.

4. A method as claimed in claim 1, in which said metal-containing composition is an element selected from the group consisting of aluminum, chromium, titanium and tantalum.

5. A method as claimed in claim 1, in which said wafer is heated to a temperature of about 850° to 950° C.

6. A method as claimed in claim 6, in which said wafer is heated for a period of about 10 to 15 minutes.

7. A method as claimed in claim 1, in which said second conductivity type impurity forms a p-n junction at the other of said major surfaces by diffusing into said other major surface from a gaseous state.

8. A method as claimed in claim 1, in which said second conductivity type impurity forms a p-n junction at the other of said major surfaces by ion implantation.

9. A method as claimed in claim 1, in which said metal-containing composition is an aluminum-tin complex in which the ratio of aluminum to tin is at least about 1 to 9.

* * * * *